(12) United States Patent
Rezayee et al.

(10) Patent No.: US 7,450,050 B2
(45) Date of Patent: Nov. 11, 2008

(54) SWITCHED-CAPACITOR RESET ARCHITECTURE FOR OPAMP

(75) Inventors: Afshin Rezayee, Richmond Hill (CA); Ken Martin, Toronto (CA); Aaron Buchwald, Newport Coast, CA (US)

(73) Assignee: Snowbush, Inc., Toronto, Ontario (CA)

( * ) Notice: Subject to any disclaimer, the term of this patent is extended or adjusted under 35 U.S.C. 154(b) by 0 days.

(21) Appl. No.: 11/732,901

(22) Filed: Apr. 5, 2007

(65) Prior Publication Data

US 2007/0247348 A1 Oct. 25, 2007

Related U.S. Application Data

(60) Provisional application No. 60/744,314, filed on Apr. 5, 2006.

(51) Int. Cl.
*H03M 1/38* (2006.01)
(52) U.S. Cl. .................................. 341/161; 341/155
(58) Field of Classification Search .......... 341/140–165
See application file for complete search history.

(56) References Cited

U.S. PATENT DOCUMENTS

| 4,820,998 | A | * | 4/1989 | Roessler et al. | 330/258 |
| 5,734,288 | A | * | 3/1998 | Dolazza et al. | 327/337 |
| 6,396,429 | B2 |  | 5/2002 | Singer et al. |  |
| 6,538,591 | B2 | * | 3/2003 | Sato et al. | 341/155 |
| 6,784,823 | B1 | * | 8/2004 | Koike | 341/167 |
| 7,133,074 | B1 | * | 11/2006 | Brehmer et al. | 348/308 |
| 7,236,393 | B2 | * | 6/2007 | Cho et al. | 365/163 |

OTHER PUBLICATIONS

Anderson et al., "A Cost-Effecient High-Speed 12-bit Pipeline ADC in 0.18m Digital CMOS", IEEE Journal of Solid State Circuits, pp. 1506-1513, Jul. 2005.
Lewis et al., "A pipeline 5MHz 9b ADC" ISSCC Digest of Technical Papers, pp. 210-211, Feb. 1987.
Limotyrakis et al. "A 150-MS/s 8-b 71-mW CMOS Time-Interleaved ADC" IEEE Journal of Solid-State Circuits, pp. 1057-1067, May 2005.
Lee, The Design of CMOS Radia-Frequency Integrated Circuits, 1st Edition, Cambridge University Press, pp. 206, 1998.
Ahuja, "An Improved Frequency Compensation Technique for CMOS Operational Amplifiers," IEEE J. Solid-State Circuits, vol. 18, pp. 629-633, Dec. 1983.

(Continued)

*Primary Examiner*—Lam T Mai
(74) *Attorney, Agent, or Firm*—Renner, Kenner, Grieve, Bobak, Tayor & Weber (57) ABSTRACT

An analog digital converter with switched-capacitor reset architecture. The analog to digital converter (ADC) includes a plurality of pipelined stages, each stage including an analog to digital converter comprising a pair of comparators outputting signals to a multiplying digital to analog converter (MDAC). The MDAC includes an opamp and a reset circuit connected to inputs of the opamp, the reset circuit including first and second capacitors and switching circuitry for pre-charging each of the first and second capacitors to a difference between the input and output common-mode voltages of the opamp, and during a reset phase of the MDAC, connecting the first capacitor between a positive input and a negative output of the opamp and connecting the second capacitor between a negative input and a positive output of the opamp to reset the opamp.

20 Claims, 6 Drawing Sheets

OTHER PUBLICATIONS

Abo et al., "A 1.5V, 10-bit, 14.3-MS/s CMOS Pipeline Analog-to-Digital Converter," IEEE J. Solid-State circuits, vol. 34, pp. 599-606, May 1999.

Mehr et al., "A 55-mW, 10-bit, 40-Msamples/s Nyquist-Rate CMOS ADC," IEEE J. Solid-State circuits, vol. 35, pp. 318-325, Mar. 2000.

* cited by examiner

SWITCHED-CAPACITOR RESET ARCHITECTURE FOR OPAMP

RELATED APPLICATIONS

This application claims the benefit of U.S. Provisional Patent Application No. 60/744,314, filed Apr. 5, 2006, which is incorporated herein by reference.

BACKGROUND

This application relates to a reset architecture for an opamp. Various applications such as set top boxes, video applications, and, powerline communications demand for high-speed, low power analog to digital converters (ADCs). As discussed in [1] T. N. Anderson et al, "A Cost-Efficient High-Speed 12-bit Pipeline ADC in $0.18^1$m Digital CMOS", IEEE Journal of Solid-State Circuits, pp. 1506-1513, July 2005; and [2] S. Lewis and P. Gray, "A pipelined 5 MHz 9b ADC", ISSCC Digest of Technical Papers, pp. 210-211, February 1987, pipelined ADC's can provide a high speed ADC solution. Typically, the stages used in a pipelined ADC include, among other things, a multiplying digital to analog converter (MDAC) that receives an input voltage as well as output from a pair of comparators. The MDAC includes an opamp that is used by the MDAC to multiply the MDAC input voltage by a fixed number and also add or substract a voltage to the input voltage based on the signals received from the comparators.

There is a need for an improved reset architecture for opamps, including for example, opamps used in pipelined analog to digital converters.

SUMMARY

According to one aspect is an analog digital converter with switched-capacitor reset architecture. The analog to digital converter (ADC) includes a plurality of pipelined stages, each stage including an analog to digital converter comprising a pair of comparators outputting signals to a multiplying digital to analog converter (MDAC). The MDAC includes an opamp and a reset circuit connected to inputs of the opamp, the reset circuit including first and second capacitor elements and switching circuitry for precharging the first and second capacitor elements to the difference between input and output common-mode voltages of the opamp, respectively, and during a reset phase of the MDAC, connecting the first capacitor element between a positive input and a negative output of the opamp and connecting the second capacitor between a negative input and a positive output of the opamp to reset the opamp.

According to another aspect is a reset circuit in combination with an opamp, the reset circuit including: first and second capacitor elements; and switching circuitry for: (i) during an operational phase of the opamp, connecting the first and second capacitor elements to voltage sources to charge the first and second capacitors elements; and (ii) during a reset phase of the opamp, connecting the first capacitor element between a positive input and a negative output of the opamp and connecting the second capacitor element between a negative input and a positive output of the opamp to reset the opamp.

According to another example embodiment there is provided a method of resetting an opamp in a multiplying digital to analog converter (MDAC) of a pipelined stage of a multistage pipelined analog to digital converter, comprising: precharging first and second capacitor elements during an operational phase of the opamp; and during a reset phase of the MDAC, connecting the first capacitor element between an input and an output of the opamp and connecting the second capacitor between a further input and a further output of the opamp to reset the opamp.

BRIEF DESCRIPTION OF THE DRAWINGS

Reference will now be made, by way of example, to the accompanying drawings which show example embodiments, and in which.

DESCRIPTION OF EXAMPLE EMBODIMENTS

Operating from a single-supply and design with standard CMOS process is a desirable feature that can be rarely found in high-speed 10-bit analog to digital converters ("ADC"s). An example embodiment ADC described in this application is a 10-bit pipelined ADC which has been designed in a 0.18 μm logic CMOS process and operates from a single 1.8V supply, although these specifications are provided by way of example only, and the can vary in different embodiments.

Figure 1:
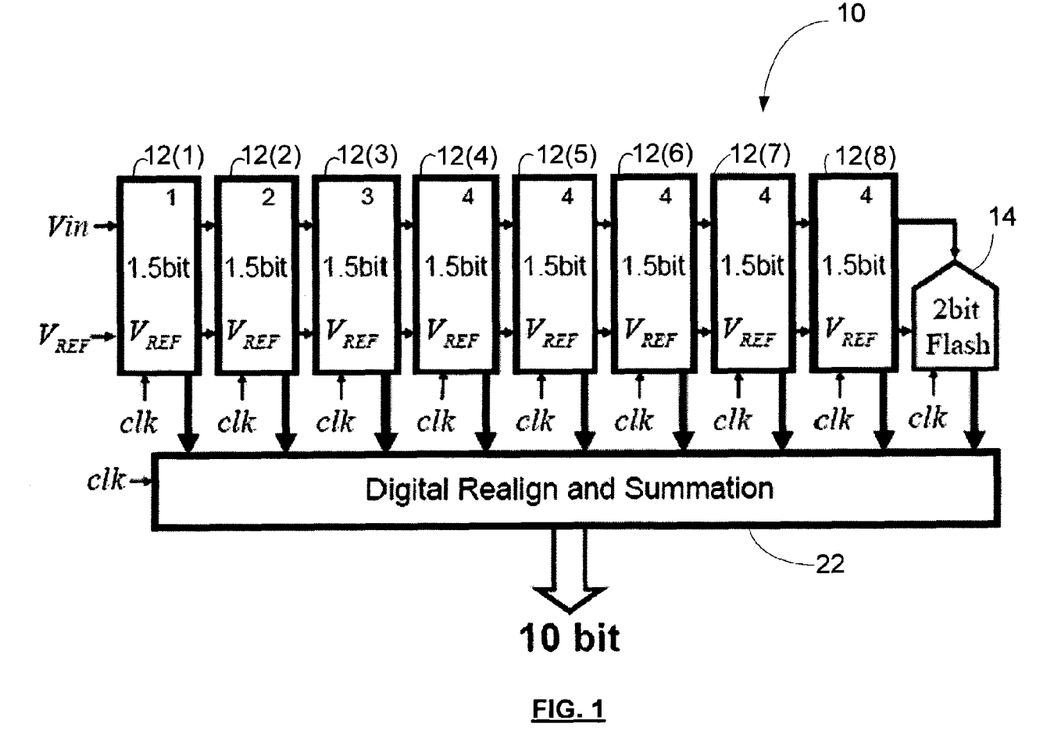
FIG. 1 is a block diagram of an analog to digital converter ("ADC") according to an example embodiment.
Figure 2:
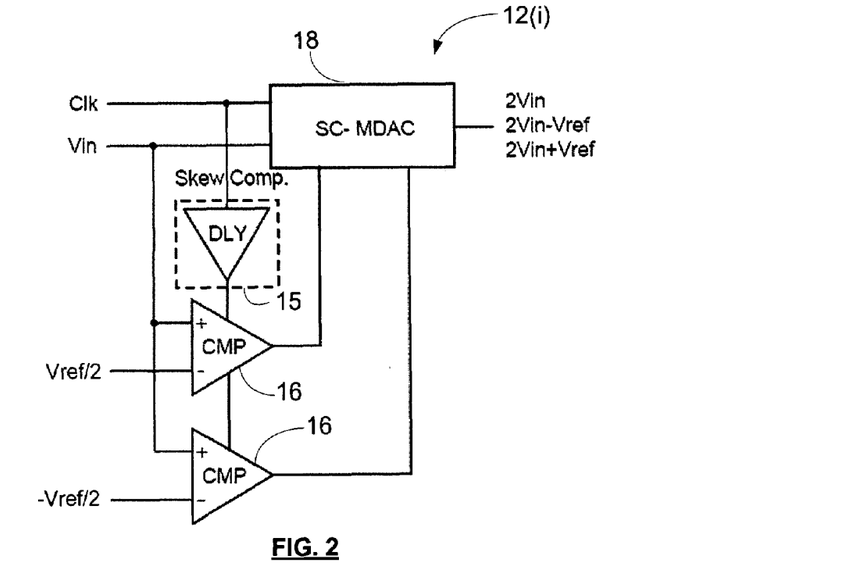
FIG. 2. is a block diagram of a 1.5-bit Pipelined Stage (shown as single-ended)
Figure 3:
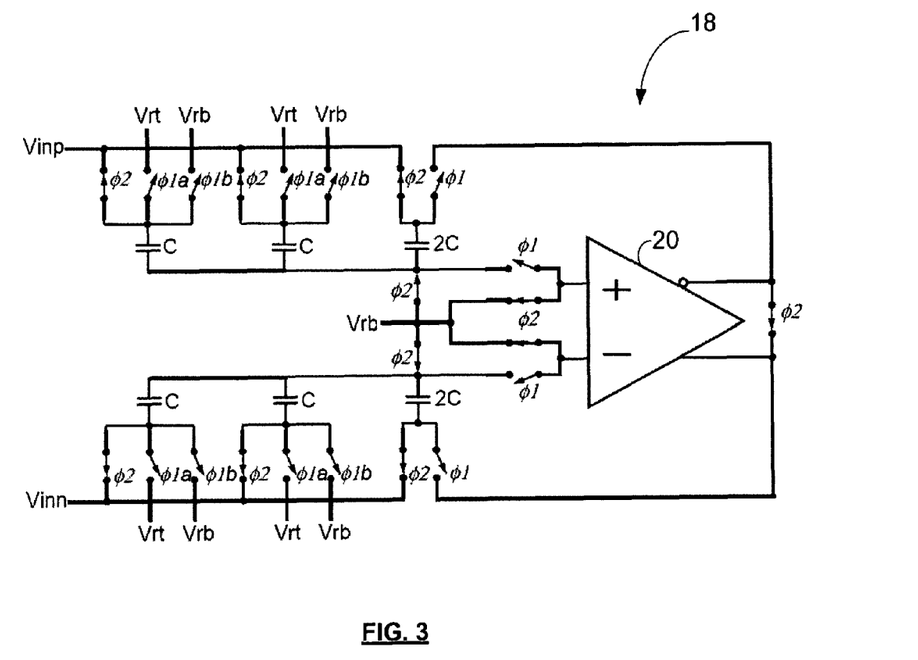
FIG. 3. is a block diagram of a multiplying analog to digital converter ("MDAC")

A block diagram representing an ADC 10 to which example embodiments described herein can be applied is shown in FIG. 1. A pipelined architecture is used with eight 1.5-bit stages 12(1)-12(8) followed by a two bit back-end flash ADC 14. Stages 12(1)-12(8) are referred to generically herein as stage 12(i) As shown in FIG. 2, each pipelined stage 12(i) includes two comparators 16 with references at ±VREF/2 and a switched-capacitor-based multiplying digital to analog converter ("MDAC") 18 which produces outputs of 2[Vin, Vin±VREF/2] depending on the state of the comparators (16). The MDAC analog residue is then fed to the sequential pipelined stages 12(i) for further processing. The 18 raw digital outputs of the pipelined stages 12(1)-12(8) and flash ADC 14 are then directed to an error-correction summing circuit 22 that produces the 10 bit ADC output. In order to facilitate and understanding of the invention described herein, FIG. 3 illustrates a the structure of example of an MDAC 18, which includes, among other things, a number of capacitors (labeled C and 2C in FIG. 3) and an op-amp 20.

As will be explained in greater detail below, to achieve 10-bit accuracy at high sample-rates, a closed-loop reset scheme is employed in a modified MDAC 18' (described below with reference to FIG. 5) that is applied to ADC 10 according to example embodiments described herein. The OPAMPs in the improved MDAC 18' use a neutrodyne drain-junction capacitor cancellation technique that can improve the linearity of the MDAC 18'. Prior to describing the MDAC 18' of FIG. 5, some discussion is provided below regarding design considerations for designing a pipelined ADC for 10-bit performance and building blocks of an ADC in order to facilitate an understanding of embodiments of the invention that are described herein.

Design Considerations for 10-bit Accuracy

The following discusses some considerations in designing an ADC 10 for 10-bit performance. To achieve 10-bit accuracy in the first pipelined stage 12(1), the capacitor size and opamp 20 gain and bandwidth for MDAC 18 should be chosen accordingly. Two constraints on capacitor sizing are noise and matching. The total capacitor size should be large enough to keep kT/C thermal noise within the required SNR. Secondly, the capacitors should be large enough to reduce the capacitors mismatch below the 10-bit requirements, thus keeping the THD within 10-bits of linearity. Two constraints on opamp 20 performance that are related to the error voltage include: Firstly, the opamp dc gain should be large enough to keep the MDAC 18 closed-loop gain error within 10-bit accuracy (the MDAC nominal gain is two). Secondly, the opamp should be fast enough to settle to its final value with less than half an LSB error during the half a clock period in which the opamp settles.

In example embodiments, for 9.5-ENOB with 99% yield and a LSB size of 1.5 mV, matching requirements of 0.2% are met if the total capacitance is larger than 500 fF. For this value the thermal noise is less than 100 uV, which is one-fourth of the quantization noise. In example embodiments, the opamp gain is greater than 65 dB (for example, 73 dB) and the opamp unity gain bandwidth should be more than 5 $f_{sample}$ (for example, 1.6-GHz).

In example embodiments, the ADC stages 12(1)-12(8) can be scaled in a traditional fashion. Since a gain of 2× is used in each pipelined stage, the accuracy requirement drops 1-bit per stage allowing stages to be sized down to reduce area and power.

ADC Building Blocks

The following describes example building blocks for an ADC.

A. First Pipelined Stage

As shown in FIG. 1 the illustrated ADC does not include a sample and hold. The first pipelined stage 12(1) acts as a sample and hold as well as the first pipelined stage. An example of a typical 1.5 bit pipelined stage 12(i) is shown in FIG. 2. The input path to the ADC 10 and the input path to the MDAC 18 have different skew. Note that due to the redundancy in the 1.5-bit stages 12(i), if the error voltage between the ADC input and the MDAC input is less than VREF/4 (assuming no other source of offset), the pipeline stage 12(i) will function properly. The skew in the input to the comparators and the input to the MDAC stages will put a limit on how fast the input can change, and, basically will limit the maximum input frequency. The skew in the first pipelined stage 12(i) is compensated with adding appropriate delay to the comparator clock signal. Such skew can be added for example through a skew component 15.

B. Opamp

Figure 4:
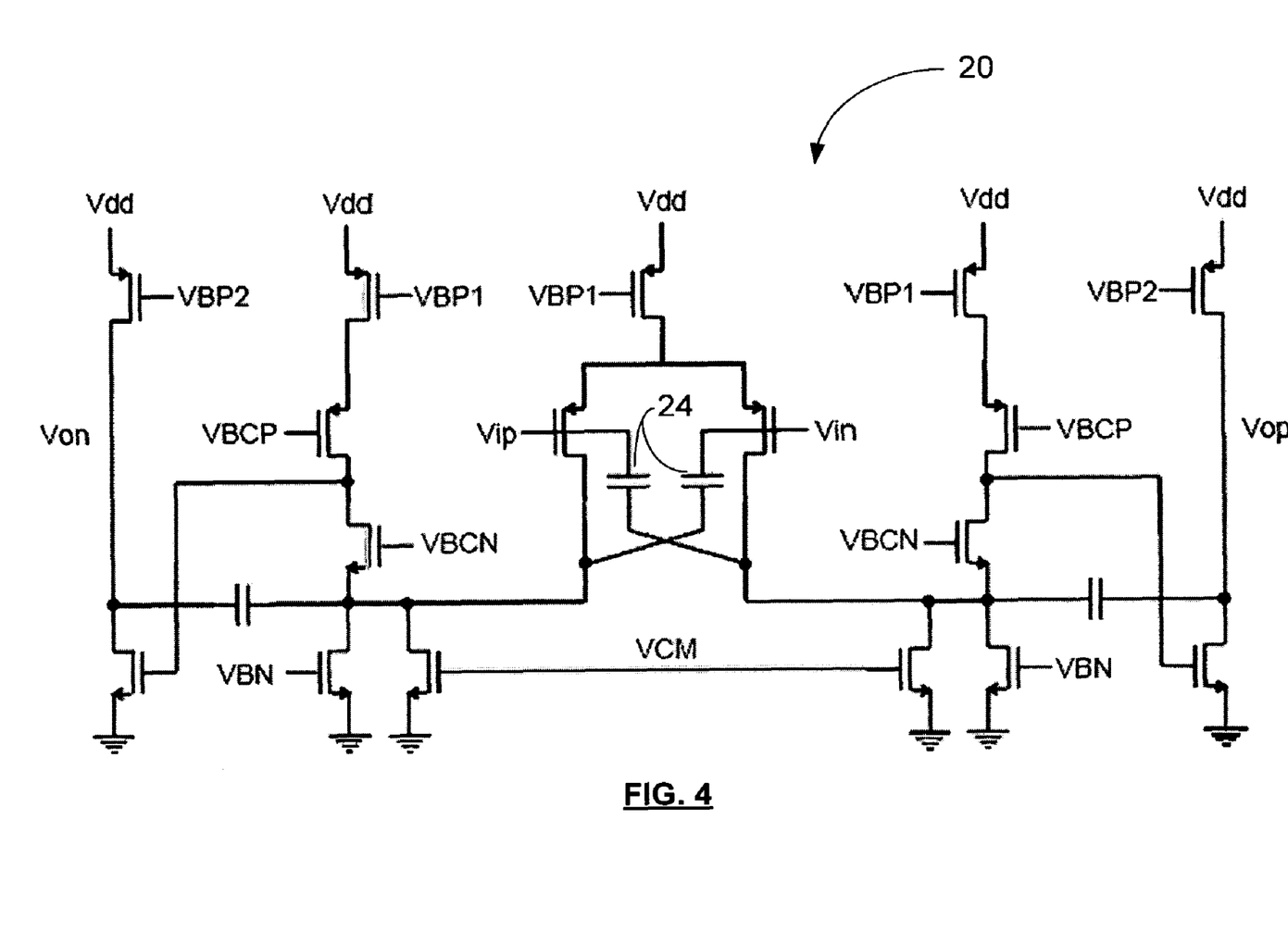
FIG. 4. is a diagrammatic view of an MDAC OPAMP according to an example embodiment.

A schematic of an example MDAC opamp 20 used in an example embodiment of the ADC MDAC 12(i) is shown in FIG. 4. The opamp 20 has a folded cascode architecture. Cascode compensation has been used to broadband the opamp 20. Cross-coupled capacitors 24 are added to the input diffpair to reduce the effect of the nonlinear gate-drain capacitors. The MDAC 18 of the first-stage 12(1) uses the largest opamp 20 in the design, and, hence, the gate-drain capacitors of the opamp input diffpair are fairly large.

C. MDAC Switches

Normal transmission gates are used in the MDACs 18. In example embodiments, the ratio between the NMOS and the PMOS are selected appropriately to minimize the variations of the transmission switch on-resistance over the input voltage variations. By way of non-limiting example, a ratio of 2/7 for the NMOS/PMOS size may be appropriate in some embodiments.

In example embodiments, the switch sizes are selected large enough to provide the small on-resistance required by the MDAC settling time, but small enough to reduce the charge-injection and the clock feed through, and switch size selection depends on the desired speed and linearity requirements.

MDAC Reset Architecture

The following discusses an example MDAC reset architecture for an ADC according to example embodiments of the present invention.

To remove the hysteresis in the pipelined stages 12(1)-12(8), and also to prevent the opamps (20) from clamping, a reset mechanism is usually employed during the sampling phase. Resetting the opamps (20) in the pipelined stages also helps to reduce the data dependent errors. A typical technique to reset the opamp 20 is a "crow-bar" technique whereby the differential inputs are tied to a common-mode reference while the outputs are shorted together (FIG. 3).

This reset technique (of FIG. 3) works fine for a single-stage opamp but may not be optimum for opamps with two or mores stages. Opamps with multiple stages can benefit from compensation capacitors for stability purposes. During a reset phase the memory in the compensation capacitors needs to be erased. If the inputs and outputs are shorted, device mismatches will result in asymmetric charges in the compensation capacitors which are typically large in comparison with the junction and gate capacitors of the opamp devices. Hence, after a reset, the opamp 20 needs a long time to recharge the compensation capacitors to their proper voltages; this will reduce the maximum speed of the pipelined stage 12(i), unless a different reset scheme is used. Often for two-stage opamps, a dual reset approach is used together with dual common-mode feedback loops. This essentially converts the circuit into a cascade of two single-stage opamps with an explicit reset for the compensation capacitor.

Figure 5:
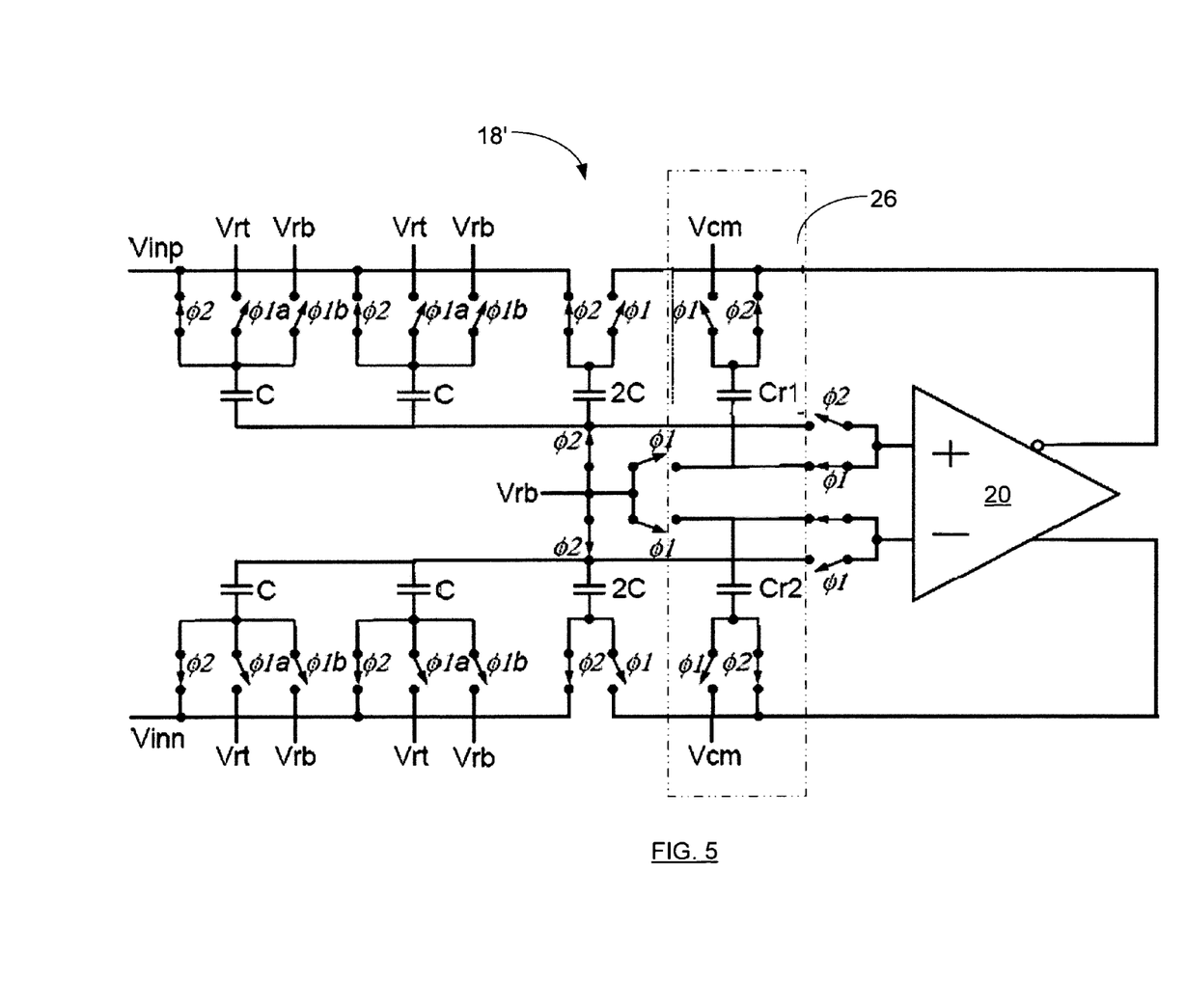
FIG. 5. is block diagram of an MDAC with a reset architecture according to an example embodiment.

In an example embodiment ADC 10 is implemented using a modified MDAC 18', shown in FIG. 5, which is similar to MDAC 18 except for differences that will be apparent from the Figures and the present description. MDAC 18' includes an opamp reset architecture 26 as shown in FIG. 5. The example reset architecture 26 utilizes four small switches φ1, φ2 and two small capacitors Cr1 and Cr2 to reset the opamp 20 while the opamp 20 is kept in a closed-loop feedback configuration. When the opamp is operational, Cr1 and Cr2 are pre-charged to Vrb and Vcm which are equal to opamp 20 input and output common-mode voltages. During the reset phase, the opamp 20 is placed in a closed loop configuration whereby Cr1 and Cr2 are connected between the inputs and the outputs of the opamp 20. Because Cr1 and Cr2 are both pre-charged to the opamp 20 input and output common-mode voltages, the opamp 20 is reset by means of the feedback loop. CR1 and CR2 are sized equal to the differential input capacitor of the opamp 20 so as to keep the feedback factor in the reset phase, the same as it is in the amplification phase. Hence, the opamp 20 during the reset phase and during the MDAC operational phase will have a closed loop configuration with identical gains. This can reduce problems with transient behavior of the opamp when transferring from reset to operation.

Cr1 and Cr2 are small capacitors, and, their corresponding switches are also selected to be very small. The switch control signals are already generated in the MDAC logic, so that no extra logic for the new reset circuit 26 is needed beyond the logic used for MDAC 18. Therefore, the reset architecture adds negligible complexity and area to a pipelined stage. Although the reset architecture of FIG. 5 is implemented using 4 switches and two capacitors, it will be appreciated that different configurations of capacitors and switches can be used to accomplish the same result. For example, each capacitor and two switch combination could be replaced with three capacitors and 6 switches (with the reset architectures then having 6 capacitors and 12 switches). The three capacitors could be charged to different voltages such that when they are connected in parallel between the opamp input and output, the parallel combination provides a voltage equal to the difference between the opamp input common-mode voltage and the opamp output common-mode voltage.

Accordingly, example embodiments of the present invention include an opamp reset architecture in which a first capacitor element and a second capacitor element can each be pre-charged to a voltage that is equal to the difference between the opamp input common-mode voltage and the opamp output common-mode voltage, and then switched to a reset phase in which the first capacitor element is connected between the positive input and negative output of the opamp and the second capacitor element is connected between the negative input and positive output of the opamp. Each capacitor element can include one or more capacitors.

Although the reset architecture have been described in the context of an opamp used in an MDAC in a pipelined ADC, an opamp using the reset architecture described herein could also be used in other applications.

Furthermore, although the stages in the ADC described above are 1.5 bit stages, in other example embodiments ADCs having pipelined stages with greater than 1.5 bits can be used. Furthermore, ADCs other than 10-bit ADCs can be implemented using the switched capacitor reset architecture described above—for example the ADC core can be enhanced to 12-bit or and 14-bit resolutions.

EXAMPLE IMPLEMENTATION

The following discusses implementation of an example board. In various embodiments, implementation details can vary from those described herein. In an example embodiment, an ADC circuit according to example embodiments can be implemented in a 0.18 μm logic CMOS technology. In an example embodiment, the padframe design is selected to reduce the noise from digital outputs fed back to the analog inputs or the reference voltage offchip decoupling caps pin. The pad-frame implements different ESD rings for the digital and analog domains to eliminate noise coupling from digital pins to the inputs. The digital buffers are also on a separate supply in an example embodiment to facilitate regulation thereof. The example board includes many decoupling caps on the supply connections. The traces on the analog inputs and the reference generator external decoupling capacitors on the example board are designed to be as short as possible. Two solid ground planes are included in the example board PCB to keep the noise floor and interference low.

Figure 6:
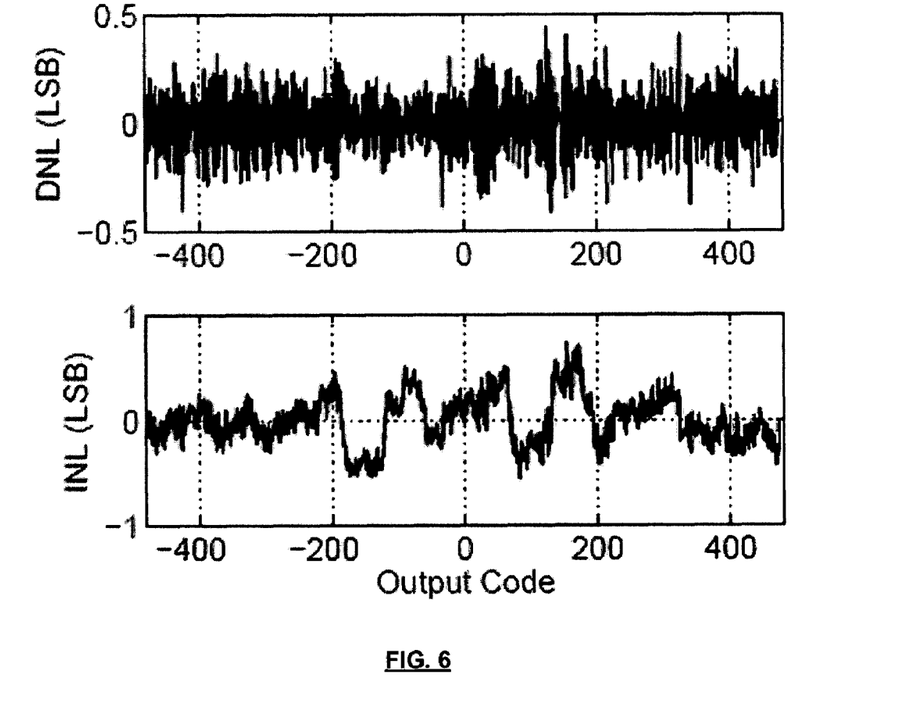
FIG. 6. shows graphs illustrating example ADC INL and DNL.
Figure 7:
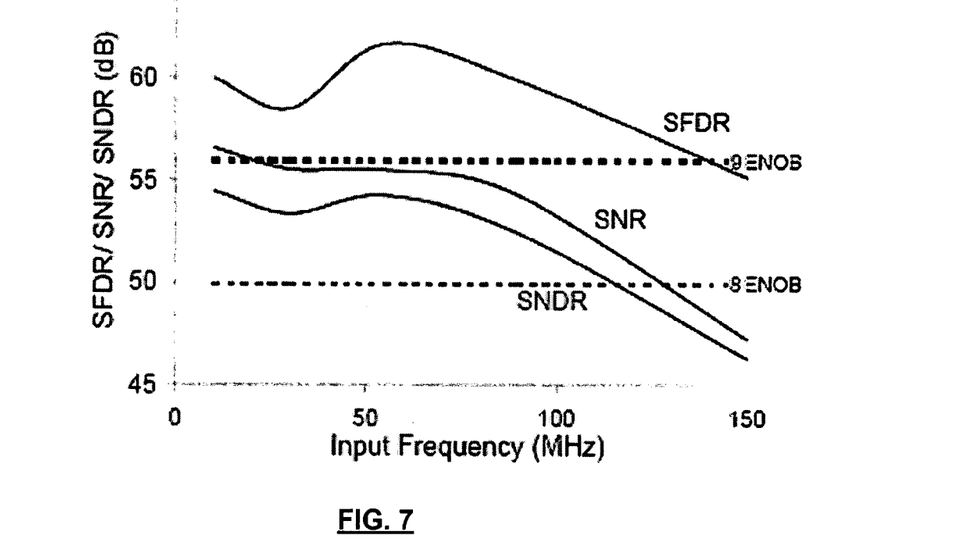
FIG. 7. shows a graph illustrating an example DC Dynamic Performance.
Figure 8:
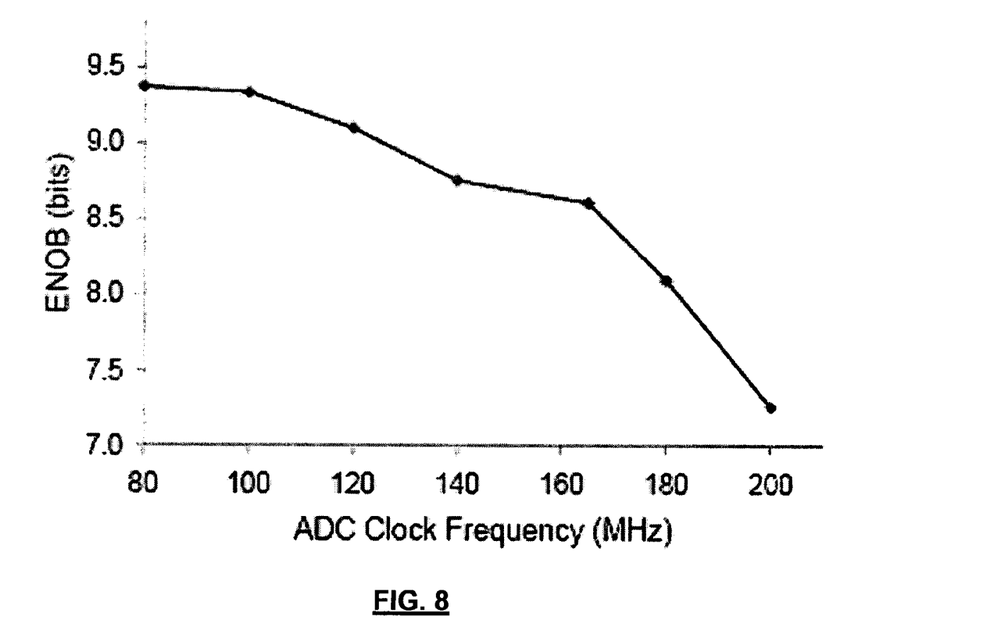
FIG. 8. shows a graph illustrating example ADC Dynamic Performance Versus Sampling Rate.

In an example, a low phase noise pulse generator is used for the ADC clock input. The ADC input is also produced with a low noise-floor signal generator. The input signal is passed through a narrow-band BPF to further remove the input harmonics and noise. FIG. 6 plots an INL and a DNL plot of an example ADC for a 10.7 MHz input frequency and a 140 MHz clock frequency. FIG. 7 shows the dynamic performance of the ADC versus clock frequency. FIG. 8 shows the dynamic performance of the ADC versus the input frequency for a 140 MHz clock frequency. The key measurement results are summarized in Table I.

TABLE I

| ADC KEY MEASUREMENT RESULTS | |
|---|---|
| Technology | Standard Logic CMOS 0.18 μm |
| Supply Voltage | 1.8 V |
| Resolution | 10 bit |
| Conversion Rate | DC-165 MHz |
| ENOB | 8.7 bits @ 140 MS/s |
| SNR | 56.5 dB @ 140 MS/s |
| SFDR | 60.8 dB @ 140 MS/s |
| INL | <0.73 |
| DNL | <0.42 |
| Power dissipation | 140 mW (refgen. power included) |
| Die size | 1.3 mm$^2$ |

In an example embodiment, a 10-b pipelined ADC can be fabricated in a 1.8V 0.18 μm logic CMOS process. Such ADC can utilizes a closed-loop reset scheme to assist in improving the transition between reset and operation of the pipelined stages. A drain junction capacitor cancellation technique can be used to improve the linearity of the pipelined stages.

The above-described embodiments are intended to be examples only. Alterations, modifications and variations may be effected to the particular embodiments by those skilled in the art without departing from the scope of the invention.

The following seven documents are incorporated herein by reference:

REFERENCES

[1] T. N. Anderson et al, "A Cost-Efficient High-Speed 12-bit Pipeline ADC in 0.18[1] m Digital CMOS", IEEE Journal of Solid-State Circuits, pp. 1506-1513, July 2005
[2] S. Lewis and P. Gray, "A pipelined 5 MHz 9b ADC", ISSCC Digest of Technical Papers, pp. 210-211, February 1987
[3] S. Limotyrakis et al, "A 150-MS/s 8-b 71-mW CMOS Time-Interleaved ADC", IEEE Journal of Solid-State Circuits, pp. 1057-1067, May 2005
[4] T. H. Lee, The Design of CMOS Radio-Frequency Integrated Circuits, 1st Edition, Cambridge University Press, 1998, page 206.
[5] B. K. Ahuja, "An improved frequency compensation technique for CMOS operational amplifiers", IEEE J. Solid-State Circuits, vol. 18, pp. 629-633, December 1983.
[6] A. M. Abo and P. R. Gray, "A 1.5-V, 10-bit, 14.3-MS/s CMOS Pipeline Analog-to-Digital Converter", IEEE J. Solid-State Circuits, vol. 34, pp. 599-606, May 1999.
[7] I. Mehr and L. Singer,, "A 55-mW, 10-bit, 40-Msample/s Nyquist-Rate CMOS ADC", IEEE J. Solid-State Circuits, vol. 35, pp. 318-325, March 2000

The invention claimed is:

1. A pipelined analog to digital converter (ADC) comprising a plurality of pipelined stages, each stage comprising an analog to digital converter comprising a pair of comparators outputting signals to a multiplying digital to analog converter (MDAC), and the MDAC comprising an opamp and a reset circuit for the opamp, wherein the reset circuit including first and second capacitor elements and switching circuitry for precharging each of the first and second capacitor elements to the difference between input and output common-mode voltages of the opamp, and wherein during a reset phase of the MDAC, connecting the first capacitor between a positive input and a negative output of the opamp and connecting the second capacitor between a negative input and a positive output of the opamp to reset the opamp.

2. The ADC of claim 1 wherein the switching circuitry precharges the first and second capacitor elements during an operational phase of the MDAC.

3. The ADC of claim 2 wherein the opamp operates in a closed loop configuration in both the reset phase and the operational phase.

4. The ADC of claim 3 wherein the opamp is a multi-stage opamp having a folded cascode architecture.

5. The ADC of claim 1 wherein the plurality of pipelined stages includes a first pipelined state whose MDAC includes the largest opamp of all the pipelined stages.

6. The ADC of claim 1 wherein the pipelined stages are each 1.5 bit stages abd the ADC comprises a 2-bit flash analog to digital converter connected to a final 1.5 bit stage of the plurality of 1.5 bit stages; and
an error correct and summing circuit connected to receive output from each of the 1.5 bit stages and the 2-bit flash analog to digital converter.

7. The ADC of claim 6 wherein the ADC is a 10-bit pipelined ADC and the number of pipelined 1.5 bit stages is eight.

8. The ADC of claim 7 wherein the ADC is fabricated in a 0.18 □m logic CMOS technology.

9. The ADC of claim 1 wherein each capacitor element consists of a single capacitor.

10. A reset circuit in combination with an opamp, the reset circuit including:
first and second capacitor elements; and
switching circuitry for: (i) during an operational phase of the opamp, connecting the first and second capacitor elements to voltage sources to charge the first and second capacitor elements; and (ii) during a reset phase of the opamp, connecting the first capacitor element between a positive input and a negative output of the opamp and connecting the second capacitor element between a negative input and a positive output of the opamp to reset the opamp.

11. The reset circuit of claim 10 wherein the opamp operates in a closed loop configuration in both the reset phase and the operational phase.

12. The reset circuit of claim 11 wherein during the operational phase, the switching circuitry connects each of the first and second capacitor elements between voltages that are equal the opamp input and output common mode voltages.

13. The reset circuit of claim 10 wherein the opamp and switching circuitry are part of a multiplying digital to analog converter (MDAC).

14. The reset circuit of claim 13 wherein the MDAC is part of a pipelined stage for a pipelined analog to digital converter.

15. The reset circuit of claim 10 wherein the opamp is a multi-stage opamp having a folded cascode architecture.

16. A method of resetting an opamp in a multiplying digital to analog converter (MDAC) of a pipelined stage of a multistage pipelined analog to digital converter, comprising:
pre-charging first and second capacitor elements during an operational phase of the opamp; and
during a reset phase of the MDAC, connecting the first capacitor element between an input and an output of the opamp and connecting the second capacitor between a further input and a further output of the opamp to reset the opamp.

17. The method of claim 16 wherein the opamp operates in a closed loop configuration in both the reset phase and the operational phase.

18. The method of claim 17 wherein precharging the first and second capacitor elements includes connecting each of the capacitor elements between voltages that are equal to the opamp input and opamp output common mode voltages.

19. The method of claim 18 wherein during the reset phase, the first capacitor element is connected between a positive input and a negative output of the opamp and the second capacitor element is connected between a negative input and a positive output of the opamp.

20. The method of claim 16 wherein the opamp is a multistage opamp having a folded cascode architecture, the pipelined stage is a 1.5 bit stage, and the capacitor elements each consist of a single capacitor.

* * * * *